United States Patent [19]

Imaizumi et al.

[11] Patent Number: 5,426,068

[45] Date of Patent: Jun. 20, 1995

[54] METHOD OF MANUFACTURING COMPOUND SEMICONDUCTOR WAFER

[75] Inventors: Toyoaki Imaizumi; Osamu Oda, both of Toda, Japan

[73] Assignee: Japan Energy Corporation, Tokyo, Japan

[21] Appl. No.: 217,886

[22] Filed: Mar. 25, 1994

[30] Foreign Application Priority Data

Apr. 1, 1993 [JP] Japan .................................. 5-075609
May 26, 1993 [JP] Japan .................................. 5-123839

[51] Int. Cl.$^6$ .................................................. H01L 21/203
[52] U.S. Cl. .................................. 437/105; 437/107; 437/126; 437/133; 437/174; 117/84
[58] Field of Search ............... 437/174, 126, 105, 107, 437/133; 148/DIG. 3; 117/84

[56] References Cited

U.S. PATENT DOCUMENTS 5,137,847 8/1992 Shimakura et al. ............ 148/DIG. 3

FOREIGN PATENT DOCUMENTS 0498000 3/1992 Japan .............................. 437/174

*Primary Examiner*—R. Bruce Breneman
*Assistant Examiner*—Ramamohan Rao Paladugu
*Attorney, Agent, or Firm*—Birch, Stewart, Kolasch & Birch

[57] ABSTRACT

An undoped p-type GaAs epitaxial layer or an n-type GaAs epitaxial layer is grown on the surface of a wafer, and thereafter the wafer is annealed at a temperature which ranges from 800° C. to 1,200° C. and is equal to or higher than a predetermined critical temperature depending on the carrier concentration in the epitaxial layer before it is annealed. The epitaxial layer thus annealed is rendered semi-insulating without addition of any impurity. Accordingly, performances of an electronic device which incorporates such a wafer are improved.

15 Claims, 4 Drawing Sheets

F I G. 1
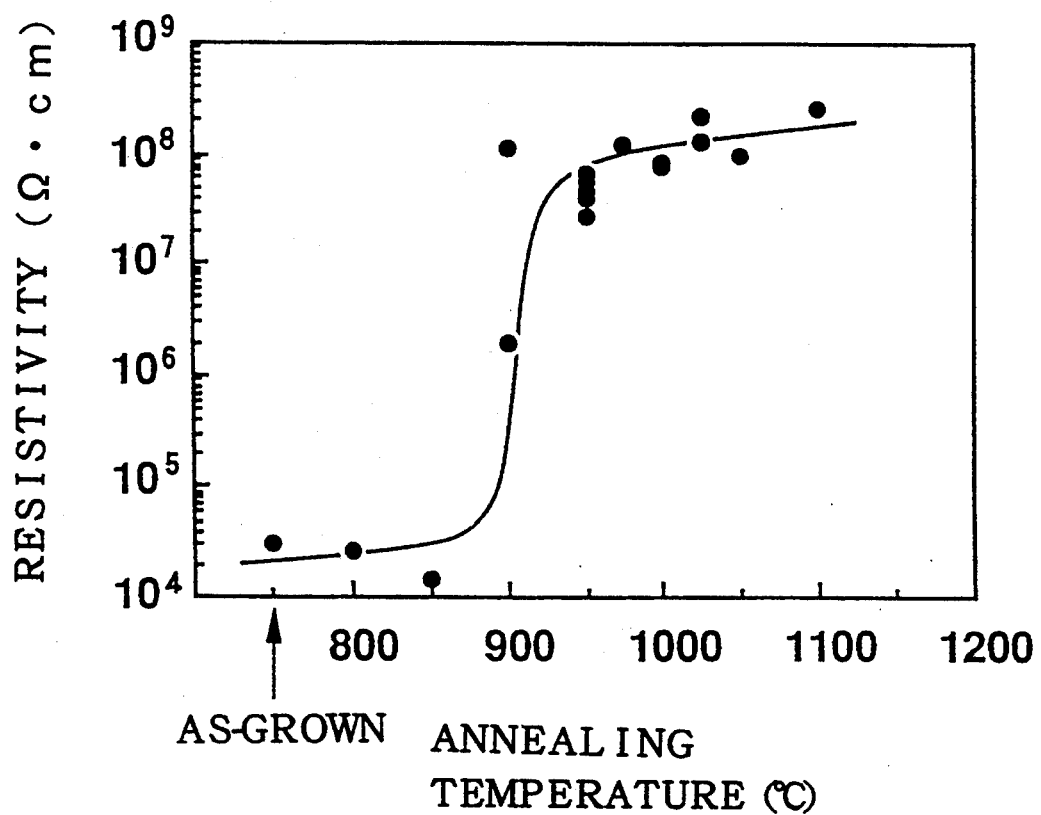

METHOD OF MANUFACTURING COMPOUND SEMICONDUCTOR WAFER

BACKGROUND OF THE INVENTION

1. Field of the Invention:

The present invention relates to a method of manufacturing a compound semiconductor wafer for use in an electronic device, and more particularly to a method of manufacturing a compound semiconductor wafer having a GaAs epitaxial layer of high resistivity.

2. Description of the Related Art:

GaAs wafers are used in electronic devices, e.g., OEICs, HEMTs, and ion-implanted FETs.

Electronic devices having a GaAs wafer fabricated from a bulk crystal have device characteristics, for example, hysteresis of current vs. voltage characteristics, a frequency-depending dispersion of drain conductances, and a kink effect, for a GaAs field-effect transistor (FET). It has been believed that these device characteristics may be deteriorated by impurities and defects which are present in the crystal.

In order to avoid such deteriorations of the device characteristics, there has been proposed an electronic device wafer having a barrier layer which comprises an epitaxial layer that is of higher quality than bulk crystals. Some of such wafers that are already used in electronic devices have a superlattice epitaxial layer of AlGaAs/GaAS produced by the MBE process or have an undoped epitaxial layer of GaAs formed by the halide process.

In semiconductor devices composed of compound semiconductors belonging to Group III-V of the periodic table, a buffer layer is employed to insulate an operative layer (active layer) from the wafer or to separate devices from each other in an integrated circuit. It is of great importance for improved device characteristics that such a buffer layer have a high resistance, i.e., being semi-insulating.

Conventionally, high-resistance layers in semiconductor devices composed of compound semiconductors belonging to Group III-V have generally been fabricated by the vapor-phase epitaxial growth process. Such high-resistance layers may be rendered semi-insulating by either supplying a doping gas containing an impurity for semi-insulation through a bypass pipe during vapor-phase epitaxial growth or adding a deep level impurity to a source material used in the vapor-phase epitaxial process and then doping an epitaxial layer on the surface of the wafer with the deep level impurity during vapor-phase epitaxial growth.

According to the former process, however, the compound of the deep level impurity introduced through the bypass pipe tends to be decomposed and deposited in the bypass pipe, or the deep level impurity is liable to react with hydrogen chloride (HCl) in the bypass pipe, resulting in the formation of a chloride that is delivered through the bypass pipe. Therefore, if the amount of such a deep level impurity to be doped is increased, then the concentration of hydrogen chloride is increased, thus undesirably etching the wafer.

The latter method is disadvantageous in that if the equilibrium segregation coefficient of the source of deep level impurity with respect to the source material is small, then a required amount of deep level impurity cannot be supplied.

The source of deep level impurity may be iron, chromium, vanadium or the like, which is a so-called "deep acceptor impurity". The device characteristics are deteriorated when the deep acceptor impurity enters from the buffer layer into the active layer. Furthermore, if an FET is fabricated by using a semiconductor wafer in which a layer with a deep acceptor impurity contained therein is formed in the interface between a buffer layer and an active layer, then a deep trap layer is created in the interface between the buffer layer and the active layer. Since such a deep trap layer traps electrons flowing through the active layer and discharges electrons into the active layer, it is responsible for causing noises.

Whereas in the case when an impurity which forms a shallow level can be compensated by another impurity which forms an opposite conductivity type shallow level, there is no adverse effect, the introduction of an impurity which forms a deep level essentially has an adverse effect on the crystal.

The applicant has previously developed a process of manufacturing a semi-insulating compound semiconductor substrate in which a p-type epitaxial layer formed on a compound semiconductor wafer is rendered semi-insulating by annealing. The manufacturing process is disclosed in Japanese laid-open patent publication No. 4-98000.

However, subsequent research has revealed that while the disclosed manufacturing process is effective to make the epitaxial layer semi-insulating, it is unable to avoid a side gate effect in an integrated circuit environment, that is, the defect of drain current fluctuations that are caused by the voltage of an adjacent device.

SUMMARY OF THE INVENTION

It is therefore an object of the present invention to provide a method of manufacturing a compound semiconductor wafer having on its surface a GaAs epitaxial layer of high resistivity.

According to the present invention, there is provided a method of manufacturing a compound semiconductor wafer, comprising the steps of: growing an undoped p-type GaAs epitaxial layer on the surface of a wafer; and thereafter, annealing the wafer at temperatures ranging from 800° C. to 1,200° C. and being not less than a predetermined critical temperature depending on the carrier concentration in the epitaxial layer before the wafer annealing, thereby making the epitaxial layer semi-insulating. Preferably, the wafer annealing may be performed under an arsenic vapor pressure. The wafer annealing may be performed at approximately 950° C. for approximately 3 hours.

According to the present invention, there is also provided a method of manufacturing a compound semiconductor wafer, comprising the steps of: growing an n-type GaAs epitaxial layer on the surface of a wafer; and thereafter, annealing the wafer at a temperature which is not higher than 1,200° C. and is not lower than a predetermined critical temperature depending on the carrier concentration in the epitaxial layer before the wafer annealing, thereby making the epitaxial layer semi-insulating. Preferably, the wafer annealing may be performed under an arsenic vapor pressure. The wafer annealing may be performed at approximately 950° C. for approximately 3 hours or at approximately 1100° C. for approximately 3 hours.

The wafer annealing is performed at a temperature which is not higher than 1,200° C. because if it were performed at a temperature higher than 1,200° C., then the surface of the GaAs epitaxial layer would be dissociated.

The wafer with the undoped p-type GaAs epitaxial layer grown thereon is annealed at a temperature not lower than 800° C. because if it were annealed at a temperature lower than 800° C. then the concentration of a deep level in the epitaxial layer would be so lowered that the condition: [Ndeep]>[Nepi] would not be satisfied. In this equation, [Nepi] means the carrier concentration in the GaAs epitaxial layer before being annealed, and [Ndeep] means the concentration of a deep level occurring in the epitaxial layer after being annealed.

The wafer annealing is preferably performed in the presence of an arsenic vapor pressure. However, if the wafer annealing is performed after the surface of the epitaxial layer is covered with a protection film, e.g., silicon nitride film or the like, no arsenic vapor pressure needs to be applied.

When the wafer with the undoped p-type GaAs epitaxial layer grown thereon is annealed in the above temperature range, defects acting as a deep level (EL2) are formed in the epitaxial layer. Therefore, an impurity (a shallow acceptor) forming a shallow level in the epitaxial layer is compensated with the defects such as the deep level (a deep donor), and makes the epitaxial layer semi-insulating. The undoped p-type GaAs epitaxial layer can be made semi-insulating with a relatively low concentration of deep level (EL2).

When the wafer with the n-type GaAs epitaxial layer is annealed in the above temperature range, a shallow acceptor is formed in the epitaxial layer. Consequently, an impurity (a shallow donor) forming a shallow level in the epitaxial layer is compensated with the shallow acceptor, and also by a deep donor formed at the same time, and makes the epitaxial layer semi-insulating.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 1 is a graph showing the relationship between the resistivity of a GaAs wafer annealed by the method according to the present invention and the annealing temperature thereof.

DETAILED DESCRIPTION OF THE PREFERRED EMBODIMENTS

As a result of research efforts that the inventors have made with respect to rendering GaAs epitaxial layers semi-insulating, the inventors have come to find out that the p-type GaAs epitaxial layer disclosed in the above-described prior development fails to obtain sufficient device performances for the reason that a deep level is not sufficiently created, and that it is possible to increase the concentration of defects which will act as a deep level for sufficiently making a GaAs epitaxial layer semi-insulating by employing stricter conditions for wafer annealing.

The inventors annealed wafers with undoped p-type GaAs epitaxial layers grown thereon under various temperature conditions, and checked them for the relationship between their resistivity and the annealing temperature. The results of the test are shown in FIG. 1. It can be understood from FIG. 1 that the resistivity increases as the annealing temperature rises, specifically, the resistivity becomes 107 $\Omega$.cm or higher when the annealing temperature is 950° C. or higher, and that there is a critical temperature of about 900° C. beyond which the wafer exhibits a semi-insulating property.

The inventors also prepared wafers with undoped p-type GaAs epitaxial layers grown thereon which have various carrier concentrations under different epitaxial growth conditions, and checked them for the dependence of the annealing temperature. As a consequence, it was found out that the critical temperature depended on the carrier concentration [Nepi] in the GaAs epitaxial layer before being annealed, the GaAs epitaxial layer was rendered semi-insulating by increasing the annealing temperature when the carrier concentration [Nepi] was high, and the GaAs epitaxial layer could be made semi-insulating at a lower annealing temperature when the carrier concentration [Nepi] was lower. The graph shown in FIG. 1 indicates the resistivities which were measured after the substrates with undoped p-type GaAs epitaxial layers grown thereon having a carrier concentration [Nepi] of $1 \times 10^{13} cm^{-3}$ had been annealed.

Figure 2:
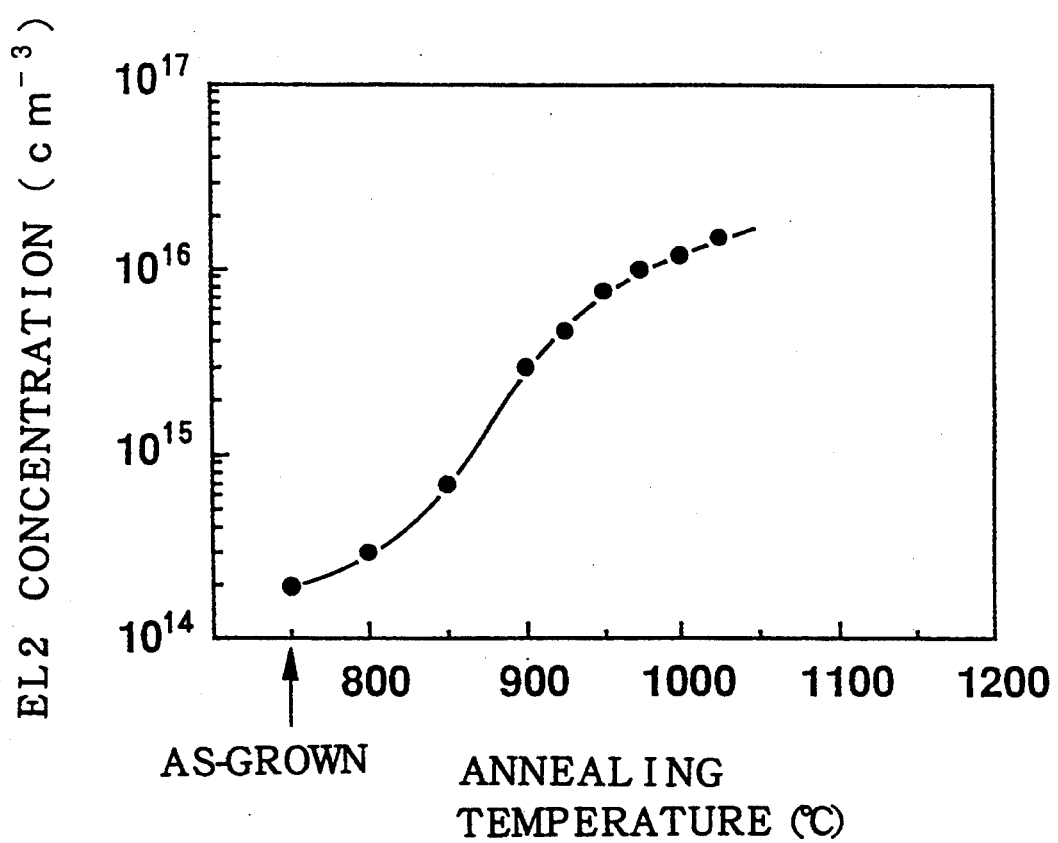
FIG. 2 is a graph showing the relationship between the concentration of the deep level (EL2) of a GaAs epitaxial layer on the wafer annealed by the method according to the present invention and the annealing temperature thereof.

In order to ascertain the relationship between the deep level (EL2) in an epitaxial layer and the annealing temperature, the inventors also annealed wafers with electrically conductive n-type GaAs epitaxial layers grown thereon having a carrier concentration of $4 \times 10^{16} cm^{-3}$, and measured the concentration [Ndeep] of a deep level (EL2) that occurred in the epitaxial layer of each of the wafers by the isothermal capacitance transient spectroscopy (ICTS) method. The results of the test are shown in FIG. 2. The study of FIG. 2 indicates that the concentration [Ndeep] of a deep level depends on the annealing temperature.

It follows from the results shown in FIG. 2 that the epitaxial layer is made semi-insulating at the critical temperature or higher beyond which the concentration [Ndeep] of the deep level in the epitaxial layer of the wafer after being annealed is greater than a certain value, with respect to the carrier concentration [Nepi] in the epitaxial layer of the wafer before being annealed.

Figure 3:
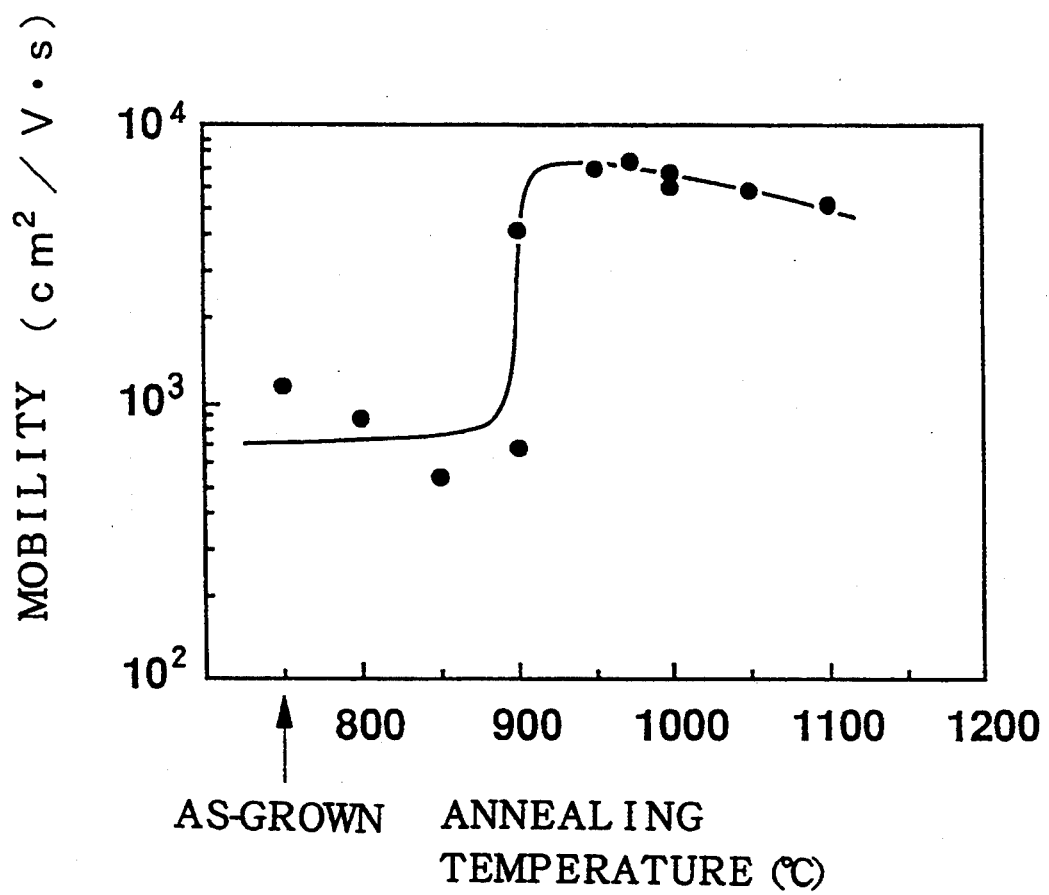
FIG. 3 is a graph showing the relationship between the mobility of the GaAs wafer annealed by the method according to the present invention and the annealing temperature thereof.

The mobility of the epitaxial layers as plotted against the annealing temperature is shown in FIG. 3.

Figure 4:
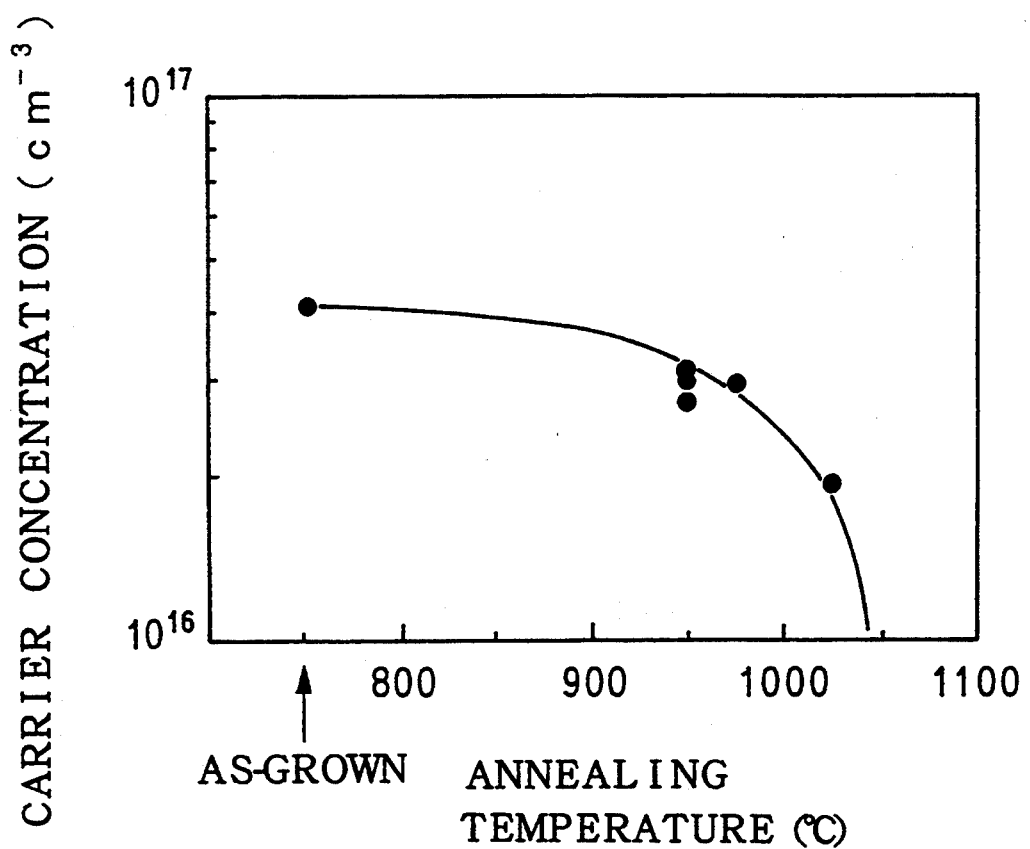
FIG. 4 is a graph showing the relationship between the annealing temperature of a silicon-doped n-type GaAs epitaxial layer and the carrier concentration after the silicon-doped n-type GaAs epitaxial layer is annealed.

The inventors further conducted an experiment on making an n-type epitaxial layer semi-insulating, and revealed that a wafer with a silicon-doped n-type GaAs epitaxial layer grown thereon could be made semi-insulating by annealing. Specifically, the inventors discovered the relationship as shown in FIG. 4 between the annealing temperature of a silicon-doped n-type GaAs epitaxial layer having a carrier concentration of $4 \times 10^{16} cm^{-3}$ and the carrier concentration in the annealed epitaxial layer. It can be seen from FIG. 4 that the carrier concentration gradually decreases when the annealing temperature rises beyond 950° C., and the carrier concentration sharply drops when the annealing temperature rises beyond 1,050° C. The inventors considered that the carrier concentration is reduced because some shallow acceptor is generated in the epitaxial layer by the annealing and compensates silicon impurities which act as a donor.

The inventors then formed the conclusion that a GaAs epitaxial layer often contains, by nature, carbon as an impurity which will become a shallow acceptor, and a shallow donor which cannot fully be compensated with the carbon is compensated with a shallow acceptor that is generated by annealing, with the simultaneous generation of a deep level (EL2) that makes the GaAs epitaxial layer semi-insulating.

Now, Examples according to the present invention will be described below.

EXAMPLE 1:

(100) wafers oriented 2° toward (110) plane were cut from an undoped GaAs single crystal that had been grown by the LEC (Liquid Encapsulated Czochralski) method, and polished to obtain a mirror finish. Thereafter, undoped p-type GaAs layers were grown by epitaxial growth on the wafer of GaAs single crystal by a hot wall type of chloride vapor phase epitaxial system (chloride CVD method).

Specifically, a boat containing gallium having a purity of 7 N as a material of Group III and GaAs single crystal wafers were placed in position in a reactor tube, and heated to 850° C. and 750° C. by an electric furnace, respectively. An arsenic source, in the form of arsenic trichloride (AsCl3), was placed in a bubbler, and a $H_2$ gas was supplied as a carrier gas upstream of the boat in the reactor tube. The entire gas was supplied at a rate of 1 SLM, and the mole fraction of arsenic trichloride was $1 \times 10^{-2}$. Under these conditions undoped GaAs epitaxial layers having a thickness of 60 μm were grown.

In the chloride CVD method, the epitaxial layers tend to be n-type conductive because Si contamination is introduced from the reactor tube made of quartz into the epitaxial layer. In order to reduce the Si contamination, an HCl gas was introduced into the reactor tube during epitaxial growth and thereby p-type epitaxial layers were realized. The produced p-type GaAs epitaxial layer was measured for a carrier concentration, a resistivity, and a mobility. The measured carrier concentration was $1 \times 10^{13} cm^{-3}$, the measured resistivity was $10^4$ Ω.cm, and the measured mobility was in the range of 400 to 800 $cm^2/V.sec$.

The GaAs wafers with the grown epitaxial layer were taken out from the reactor tube, and placed together with an amount of arsenic into a quartz ampule and sealed in vacuum within the quartz ampule. At this time, the amount of arsenic was determined such that a vapor pressure of 1 atm would be obtained at a temperature of 950° C. so that no arsenic would volatilize from the wafer surface upon annealing. Then, the quartz ampule was placed in a heating furnace, annealed at an annealing temperature of approximately 950° C. for approximately 3 hours, and then cooled.

After the wafer annealing, the surface of the wafer was lapped and polished by a thickness of about 10 μm to remove thermally damaged layers. Thereafter, the resistivity and mobility of the GaAs epitaxial layer were measured according to the Van der Pauw method. The resistivity was $1 \times 10^8$ Ω.cm, and the mobility was 7,000 $cm^2/V.sec$.

To measure the concentration of the deep level (EL2) of the GaAs epitaxial layer, Si doped n-type epitaxial layers were grown and annealed under the same conditions as described above. Thereafter, the concentrations of the deep level (EL2) before and after the wafer annealing were measured according to the Isothermal Capacitance Transient Spectroscopy (ICTS) method by forming double Schottky electrodes. The concentration of the deep level (EL2) before the wafer annealing was $2 \times 10^{14} cm^{-3}$, and the concentration of the deep level (EL2) after the annealing was $8 \times 10^{15} cm^{-3}$.

The wafer thus annealed was then processed with an AB etchant, and the surface of the epitaxial layer was measured for an etch pit density (EPD). The measured etch pit density was $6 \times 10^3 cm^{-3}$, and it was confirmed that the AB-EPD was smaller than that of conventional bulk crystals.

The above epitaxial growth and wafer annealing were repeated several times under the same conditions as described above, and the produced epitaxial layers were measured for the resistivity, the mobility, and the concentration of the deep level (EL2). The measured values were substantially the same for all the epitaxial layers. This indicates that the wafer annealing exhibits good reproducibility.

After the wafers had been annealed for semi-insulation under the above conditions, the wafers with a cap material ($SiN_x$) were heated again at a temperature of 850° C., held for 15 minutes, and then measured for the resistivity, the mobility, and the concentration of the deep level (EL2). The measured values remained substantially the same as before. It can thus be seen that an annealed wafer as described above has good thermal stability, and that the performances of an electronic device which incorporates such an annealed wafer will not be degraded by an activation annealing that is performed upon fabrication of such an electronic device.

EXAMPLE 2:

Si-doped n-type GaAs layers were grown by epitaxial growth on the wafers of GaAs single crystal by the chloride CVD method under substantially the same conditions as in Example 1.

Specifically, a boat containing gallium and GaAs single crystal wafers were placed at a predetermined position in a reactor tube, and heated to 850° C. and 750° C. by an electric furnace, respectively. Arsenic trichloride (AsCl3) was supplied upstream of the boat in the reactor tube by using a $H_2$ gas as a carrier gas. Silane (SiH4) was supplied as a dopant gas downstream of the boat and upstream of the wafer and thereby Si-doped n-type GaAs epitaxial layers having a thickness of 60 μm were grown. The epitaxial layer had a carrier concentration of $2 \times 10^{15} cm^{-3}$.

Then, the GaAs wafers with the grown epitaxial layer were taken out from the reactor tube, and placed together with an amount of arsenic into two quartz ampules and sealed in vacuum within the quartz ampule. Then, two similar quartz ampules were annealed at approximately 1,000° C. and 1,100° C., respectively, for approximately 3 hours, and then cooled.

After the wafer annealing, the surface of each wafer was lapped and polished by a thickness of about 10 μm to remove themally damaged layers. Thereafter, the resistivity of the GaAs epitaxial layer was measured according to the Van der Pauw method. The resistivity of the GaAs epitaxial layer of the wafer which was annealed at 1,000° C. was $5\times10^4$ $\Omega.cm$, indicating that the GaAs epitaxial layer was not made semi-insulating. On the other hand, the resistivity of the GaAs epitaxial layer of the wafer which was annealed at 1,100° C. was $2.6\times10^7$ $\Omega.cm$, indicating that the GaAs epitaxial layer was made semi-insulating.

EXAMPLE 3:

Undoped n-type GaAs layers were grown by epitaxial growth on the wafers of GaAs single crystal by the chloride CVD method under substantially the same conditions as in Example 1.

Specifically, while the HCl gas was introduced into the reactor tube to reduce any silicon contamination in order to form p-type GaAs epitaxial layers in Example 1, GaAs epitaxial layers were grown by epitaxial growth without introducing an HCl gas into the reactor tube in Example 3.

The wafers having the grown GaAs epitaxial layers were placed together with arsenic in a quartz ampule, and sealed in vacuum in the quartz ampule. After the quartz ampule was annealed at 950° C. for 3 hours, it was cooled.

The resistivity and mobility of the annealed GaAs epitaxial layers were measured in the same manner as in Example 1. The resistivity was $8.2\times10^7$ $\Omega.cm$, and the mobility was 5,400 $cm^2/V.sec$.

In the method of the present invention, as described above, an undoped p-type GaAs epitaxial layer is grown on the surface of a wafer, and thereafter the wafer is annealed at a temperature which ranges from 800° C. to 1,200° C. and is equal to or higher than a predetermined critical temperature depending on the carrier concentration in the epitaxial layer before it is annealed. Since defects (EL2) acting as a deep level in the undoped GaAs epitaxial layer are formed by the annealing, an impurity (a shallow acceptor) forming a shallow level in the epitaxial layer is compensated with the defects as the deep level (a deep donor), and makes the epitaxial layer semi-insulating.

Furthermore, an n-type GaAs epitaxial layer is grown on the surface of a wafer, and thereafter the substrate is annealed at a temperature which is in a range of up to 1,200° C. and is equal to or higher than a predetermined critical temperature depending on the carrier concentration in the epitaxial layer before it is annealed. Since a shallow acceptor is created in the epitaxial layer by the annealing, an impurity (a shallow donor) forming a shallow level in the epitaxial layer is compensated with the shallow acceptor, and also by a deep level (EL2) simultaneously generated as a deep donor, and makes the epitaxial layer semi-insulating.

Inasmuch as the epitaxial layer is rendered semi-insulating without addition of any impurity, when an electronic device such as an FET is fabricated by using such a wafer, no trap layer will be formed in the interface between a buffer layer and an active layer and hence the device performances will not be degraded. In addition, as the epitaxial layer has a high resistivity, it is effective to prevent a side gate effect from taking place.

Although certain preferred embodiments of the present invention has been shown and described in detail, it should be understood that various changes and modifications may be made therein without departing from the scope of the appended claims.

What is claimed is:

1. A method of manufacturing a compound semiconductor wafer, comprising the steps of:
   growing an undoped p-type GaAs epitaxial layer on the surface of a wafer; and
   thereafter, annealing the wafer at a temperature ranging from 800° C. to 1,200° C. and being not lower than a critical temperature depending on the carrier concentration in the epitaxial layer before the wafer annealing, thereby making the epitaxial layer semi-insulating.

2. A method according to claim 1, wherein said wafer annealing is performed under an arsenic vapor pressure.

3. A method according to claim 1, wherein said wafer annealing is performed at approximately 950° C. for approximately 3 hours.

4. A method according to claim 1, wherein said wafer before growing the epitaxial layer is fabricated by cutting an undoped GaAs single crystal which was grown by the Liquid Encapsulated Czochralski method and thereafter by polishing it to a mirror finish.

5. A method according to claim 4, wherein said undoped GaAs single crystal is cut along the (100) plane oriented approximately 2° off toward the (110) plane.

6. A method according to claim 1, wherein said undoped p-type type GaAs epitaxial layer is grown by a hot wall type of chloride CVD method.

7. A method according to claim 6, wherein the epitaxial growth by said chloride CVD method is performed while an HCl gas was introduced into the reactor tube so as to form a p-type epitaxial layer.

8. A method of manufacturing a compound semiconductor wafer, comprising the steps of:
   growing an undoped n-type GaAs epitaxial layer on a surface of a wafer; and
   thereafter, annealing the wafer at a temperature which is not higher than 1,200° C. and is not lower than a critical temperature depending on the carrier concentration in the epitaxial layer before the wafer annealing, thereby making the epitaxial layer semi-insulating.

9. A method according to claim 8, wherein said wafer annealing is performed under an arsenic vapor pressure.

10. A method according to claim 8, wherein said wafer annealing is performed at approximately 1100° C. for approximately 3 hours.

11. A method according to claim 8, wherein said wafer annealing is performed at approximately 950° C. for approximately 3 hours.

12. A method according to claim 8, wherein said wafer before growing the epitaxial layer is fabricated by cutting an undoped GaAs single crystal which was grown by the Liquid Encapsulated Czochralski method and thereafter by polishing it to a mirror finish.

13. A method according to claim 8, wherein said undoped GaAs single crystal is cut along the (100) plane oriented approximately 2° off toward the (110) plane.

14. A method according to claim 8, wherein said Si-doped n-type GaAs epitaxial layer is grown by a hot wall type of chloride CVD method.

15. A method according to claim 8, wherein the epitaxial growth by said chloride CVD method is performed while a silane ($SiH_4$) was supplied as a dopant gas.

* * * * *